US011323129B2

(12) United States Patent
Pu et al.

(10) Patent No.: US 11,323,129 B2
(45) Date of Patent: May 3, 2022

(54) CIRCUIT FOR GENERATING MULTI-PHASE CLOCK HAVING RANDOM DISTURBANCE ADDED THERETO

(71) Applicant: NO.24 RESEARCH INSTITUTE OF CHINA ELECTRONICS TECHNOLOGY GROUP CORPORATION, Chongqing (CN)

(72) Inventors: Jie Pu, Chongqing (CN); Gangyi Hu, Chongqing (CN); Dongbing Fu, Chongqing (CN); Zhengping Zhang, Chongqing (CN); Liang Li, Chongqing (CN); Ting Li, Chongqing (CN); Daiguo Xu, Chongqing (CN); Mingyuan Xu, Chongqing (CN); Xiaofeng Shen, Chongqing (CN); Xianjie Wan, Chongqing (CN); Youhua Wang, Chongqing (CN)

(73) Assignee: NO.24 RESEARCH INSTITUTE OF CHINA ELECTRONICS TECHNOLOGY GROUP CORPORATION, Chongqing (CN)

(*) Notice: Subject to any disclaimer, the term of this patent is extended or adjusted under 35 U.S.C. 154(b) by 0 days.

(21) Appl. No.: 17/257,315

(22) PCT Filed: Dec. 13, 2018

(86) PCT No.: PCT/CN2018/120792
§ 371 (c)(1),
(2) Date: Dec. 31, 2020

(87) PCT Pub. No.: WO2020/019633
PCT Pub. Date: Jan. 30, 2020

(65) Prior Publication Data
US 2021/0184689 A1 Jun. 17, 2021

(30) Foreign Application Priority Data

Jul. 24, 2018 (CN) .......................... 201810821512.2

(51) Int. Cl.
*H03M 1/12* (2006.01)
*G06F 1/10* (2006.01)
*H03M 1/06* (2006.01)

(52) U.S. Cl.
CPC ............ *H03M 1/1215* (2013.01); *G06F 1/10* (2013.01); *H03M 1/0624* (2013.01)

(58) Field of Classification Search
CPC ..... H03M 1/1215; H03M 1/0624; G06F 1/10; G06F 1/04
(Continued)

(56) References Cited

U.S. PATENT DOCUMENTS 6,208,580 B1    3/2001  Ozeki
7,301,486 B2 *  11/2007 Wang ................. H03M 1/1004
                                                    341/118
8,174,297 B2 *  5/2012  Kwak .................. H03L 7/0805
                                                    327/155

FOREIGN PATENT DOCUMENTS

CN      1480814 A      3/2004
CN      103840796 A    6/2004
CN      105099806 A    11/2015

* cited by examiner

*Primary Examiner* — Khai M Nguyen

(57) ABSTRACT

The present disclosure provides a circuit for generating a multi-phase clock having random disturbance added thereto. The circuit for generating a clock includes a main clock module, a random signal generation module and a buffer matrix switch module. The main clock module generates N multi-phase clock signals; and the buffer matrix switch module randomly switches, under the control of a random control signal output by the random signal generation module, transmission paths of the input N multi-phase clock
(Continued)

signals, and outputs N multi-phase clock signals with random disturbance. In the present disclosure, the clock phase error is whitened by adding random disturbance. Only with a small loss of signal-to-noise ratio, the influence of a multi-phase clock phase error on the performance of a high-precision TI ADC can be eliminated in real time, and the influence of the fluctuation of a clock phase error can be tracked and eliminated.

7 Claims, 3 Drawing Sheets

(58) Field of Classification Search
USPC .......................................... 341/155; 327/141
See application file for complete search history.

$$\left.N+\triangle N\left\{\begin{array}{ccccc|ccc}
\overbrace{1 & 0 & \cdots & 0 & 0}^{N} & \overbrace{0 & \cdots & 0}^{\triangle N} \\
0 & 1 & \cdots & 0 & 0 & 0 & \cdots & 0 \\
\vdots & \vdots & \ddots & \vdots & \vdots & \vdots & \ddots & \vdots \\
0 & 0 & \cdots & 1 & 0 & 0 & \cdots & 0 \\
0 & 0 & \cdots & 0 & 1 & 0 & \cdots & 0 \\
0 & 0 & \cdots & 0 & 0 & 1 & \cdots & 0 \\
0 & 0 & \ddots & 0 & 0 & 0 & \ddots & 0 \\
0 & 0 & \cdots & 0 & 0 & 0 & \cdots & 1
\end{array}\right.\right.$$

FIG. 5

CIRCUIT FOR GENERATING MULTI-PHASE CLOCK HAVING RANDOM DISTURBANCE ADDED THERETO

CROSS REFERENCES TO RELATED APPLICATIONS

This is a Sect. 371 National Stage application of a PCT International Application No. PCT/CN2018/120792, filed on Dec. 13, 2018, which claims priority of a Chinese Patent Applications No. 2018108215122, filed on Jul. 24, 2018, the content of which is hereby incorporated by reference in its entirety for all purposes.

TECHNICAL FIELD

The present disclosure relates to the field of integrated circuits, and in particular, to a circuit for generating a clock, and more particularly, to a circuit for generating a multi-phase clock having random disturbance added thereto.

BACKGROUND

In a time-interleaved analog-to-digital converter (TI ADC), the phase accuracy of a multi-phase clock directly affects system performance. A circuit for generating a multi-phase clock is often affected by factors such as process deviation and circuit mismatch, which result in an inevitable phase error. For high-precision TI ADCs, the clock phase error would lead to a significant decline in the dynamic performance of Spurious-free Dynamic Range (SFDR). Error Spurious components appearing at $k \cdot f_s/L \pm f_{in}$ ($f_s$ is the sampling frequency of TI ADC, $f_{in}$ is the input signal frequency, and L is the number of integrated channels of the TI ADC, k=1, 2, Λ, L−1) need to be corrected. The conventional method to eliminate the clock phase error usually adopts a method of foreground trimming or background real-time correction. The method of foreground trimming is simple to implement and has high stability, directly trimming the clock phase after estimating the error. However, it is difficult for the foreground trimming method to avoid the performance deterioration caused by the fluctuation of the clock phase error along with the change of the working environment. The background real-time correction method requires real-time calculation, estimation of the error amount, and then correction, which results in high complexity of circuit design and limited stability and reliability.

SUMMARY

The present disclosure provides a circuit for generating a multi-phase clock having random disturbance added thereto, to solve the problems in the traditional TI ADC clock phase error elimination technology, such as high complexity of design and implementation, limited stability and reliability, or inability to real-time track and eliminate the clock phase error that varies with the working environment.

The present disclosure provides a circuit for generating a multi-phase clock having random disturbance added thereto. The circuit for generating a clock includes a main clock module, a random signal generation module and a buffer matrix switch module.

The main clock module is to generate N multi-phase clock signals.

The buffer matrix switch module randomly switches, under the control of a random control signal output by the random signal generation module, transmission paths of the input N multi-phase clock signals, and output N multi-phase clock signals with random disturbance.

Preferably, the circuit for generating a clock further includes a delay line module, to pre-trim the phase of the N multi-phase clock signals generated by the main clock module; the buffer matrix switch module is to randomly switch, under the control of a random control signal output by the random signal generation module, transmission paths of the N multi-phase clock signals pre-trimmed by the delay line module, and output N multi-phase clock signals with random disturbance.

Preferably, the buffer matrix switch module includes an input switch matrix, an output switch matrix, and N+ΔN buffer circuits of the same structure;

the input switch matrix includes N columns of switch matrix units I, and each column of the switch matrix units I includes N+ΔN switch units I having an input terminal and an output terminal;

the output switch matrix includes N columns of switch matrix units II, and each column of the switch matrix units II includes N+ΔN switch units II having an input terminal and an output terminal;

the input terminals of each switch unit I are connected to form the input terminals of the switch matrix unit I. The k-th multi-phase clock signal is connected with the input terminals of the k-th column of switch matrix units I of the input switch matrix. The output terminals of the m-th row of switch units I of each column of the switch matrix units I are connected with the input terminals of the m-th buffer circuit, where k is an integer of [1, N], m is an integer of [1,N+ΔN], and ΔN is an integer greater than zero;

the output terminals of the m-th buffer circuit are connected with the input terminals of the m-th row of switch units II of each column of the switch matrix units II, respectively; the output terminals of each switch unit II are connected to form the output terminals of the switch matrix unit II.

Preferably, the random signal generation module generates a (N+ΔN)×N control signal matrix. The control signals belonging to the m-th row and k-th column in the control signal matrix control the on/off of the m-th row of the switch units I in the k-th column of the switch matrix units I in the input switch matrix.

The control signals belonging to the m-th row and k-th column in the control signal matrix control the on/off of the m-th row of the switch units II in the k-th column of the switch matrix units II in the output switch matrix.

Preferably, the control signals in the control signal matrix are represented by '1' or '0', '1' represents switch close control, and '0' represents switch off control. The control signals in the control signal matrix satisfy the following conditions: the column vector sum result of each column of the control signal matrix is 1; the row vector sum result of N rows is 1, and the row vector sum result of ΔN rows is 0.

Preferably, the buffer matrix switch module includes an input switch matrix, an output switch matrix, and N+ΔN buffer circuits of the same structure;

the input switch matrix includes N+ΔN columns of switch matrix units I, and each column of the switch matrix units I includes N+ΔN switch units I having an input terminal and an output terminal;

the output switch matrix includes N columns of switch matrix units II, and each column of the switch matrix units II includes N+ΔN switch units II having an input terminal and an output terminal;

the input terminals of each switch unit I are connected to form the input terminals of the switch matrix unit I. The k-th multi-phase clock signal is connected with the input terminals of the k-th column of switch matrix units I of the input switch matrix. The output terminals of the m-th row of switch units I of each column of the switch matrix units I are connected with the input terminals of the m-th buffer circuit, where k is an integer of [1, N], m is an integer of [1,N+ΔN], and ΔN is an integer greater than zero;

the input terminals of each switch unit I in the (N+1)-th to (N+ΔN-th columns of the switch matrix units I are connected with 0 level, and the output terminals of the m-th row of switch units I in the (N+1)-th to (N+ΔN)-th columns of the switch matrix units I are connected with the input terminals of the m-th buffer circuit;

the output terminal of the m-th buffer circuit is connected with the input terminals of the m-th row of switch units II of each column of the switch matrix units II, respectively; the output terminal of each switch unit II is connected to form the output terminals of the switch matrix unit II.

Preferably, the random signal generation module generates a (N+ΔN)×(N+ΔN) control signal matrix. The control signals belonging to the m-th row and k-th column in the control signal matrix control the on/off of the m-th row of the switch units I in the k-th column of the switch matrix units I in the input switch matrix. The control signals belonging to the m-th row and k'-th column in the control signal matrix control the on/off of the m-th row of the switch units I in the k'-th column of the switch matrix units I in the input switch matrix, and k' is an integer of [N+1, N+ΔN].

The control signals belonging to the m-th row and k-th column in the control signal matrix control the on/off of the m-th row of the switch units II in the k-th column of the switch matrix units II in the output switch matrix.

Preferably, the control signals in the control signal matrix are represented by '1' or '0', '1' represents switch close control, and '0' represents switch off control. The control signal in the control signal matrix satisfies the following conditions: the column vector sum result of each column of the control signal matrix is 1, and the row vector sum result of each row is 1.

As described above, the circuit for generating a multi-phase clock having random disturbance added thereto of the present disclosure has the following beneficial effects:

In the present disclosure, the clock phase error is whitened by pre-trimming and adding random disturbance. Only with a small loss of signal-to-noise ratio, the influence of a multi-phase clock phase error on the performance of a high-precision TI ADC can be eliminated in real time, and the influence of the fluctuation of a clock phase error along with a change in a working environment can be tracked and eliminated. A spurious error component at a fixed frequency is whitened to a noise floor without interrupting the normal operation of the TI ADC. The design is simple to realize, and the stability is high.

BRIEF DESCRIPTION OF THE DRAWINGS

FIG. 5 is a schematic diagram showing another structure of a control signal matrix according to an Embodiment of the present disclosure.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
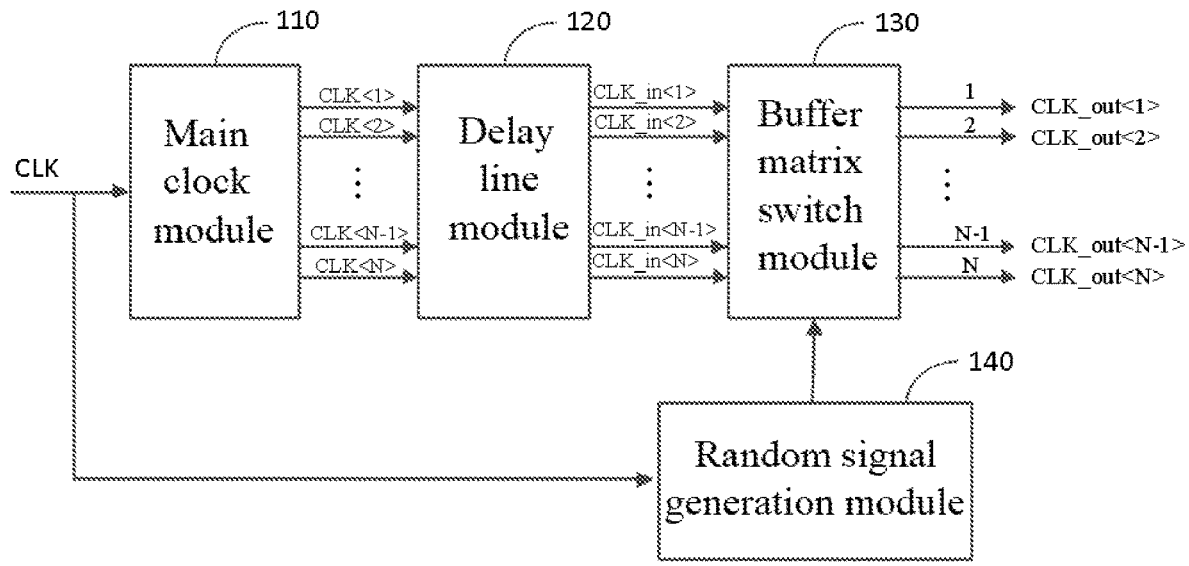
FIG. 1 is a schematic diagram of a circuit for generating a multi-phase clock having random disturbance added thereto according to an Embodiment of the present disclosure.

FIG. 1 is a schematic diagram of a circuit for generating a multi-phase clock having random disturbance added thereto according to an Embodiment of the present disclosure. The circuit for generating a multi-phase clock having random disturbance added thereto includes a main clock module 110, a buffer matrix switch module 130 and a random signal generation module 140. The main clock module 110 generates N multi-phase clock signals CLK<1: N>. The buffer matrix switch module 130 randomly switches, under the control of a random control signal output by the random signal generation module 140, transmission paths of the N multi-phase clock, and outputs N multi-phase clock with random disturbance, so as to transform the fixed clock phase error between the multi-phase clock signals into an approximately irregular clock jitter.

In the present disclosure, the inherent mode of the multi-phase clock output state is broken by adding random disturbance, the phase error of the multi-phase clock is whitened to a clock jitter. In this way, the influence of the phase error on the spurious error component of the time-interleaved analog-to-digital converter (TI ADC) at a specific frequency is eliminated. The dynamic performance of Spurious-free Dynamic Range (SFDR) can be improved with only a small loss of signal-to-noise ratio.

As an improvement in this embodiment, the circuit for generating a multi-phase clock further includes a delay line module 120, which can pre-trim the generated multi-phase clock phase. Specifically, the pre-trimming refers to measuring the phase error amount between multi-phase clocks under a certain working environment through a mature foreground trimming technology, and then controlling the delay line module 120 to realize the trimming, so as to minimize the phase error between multi-phase clocks as much as possible. Pre-trimming is beneficial to whiten the residual phase error after the random switching of the clock transmission paths, and to reduce the influence of the clock phase error whitening operation on the noise floor.

Figure 2:
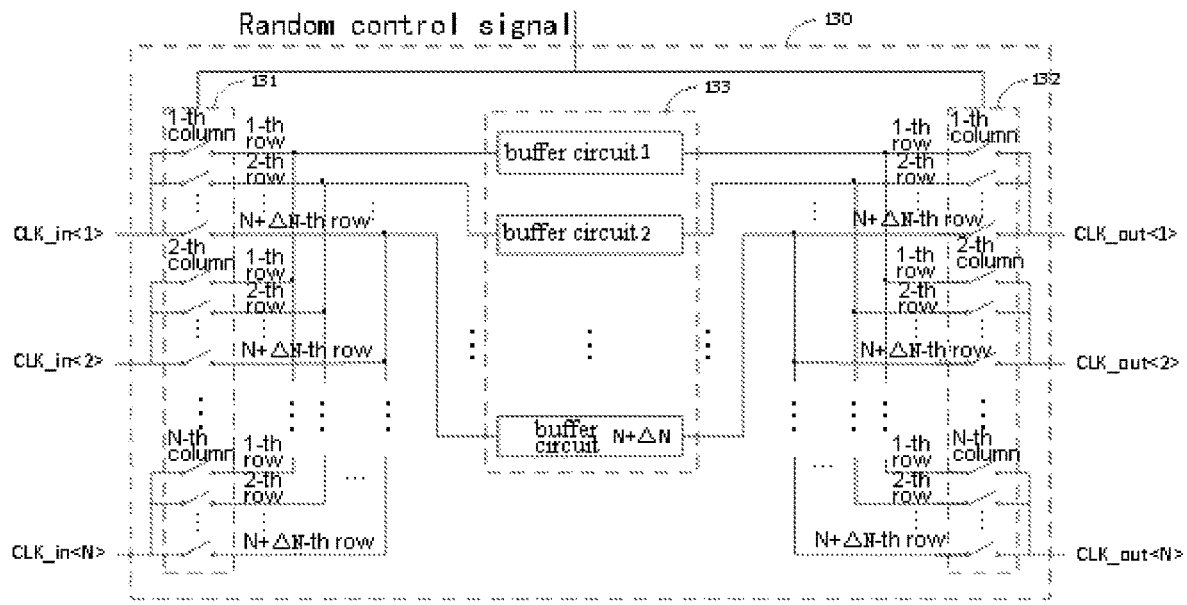
FIG. 2 is a schematic diagram of a structure of a buffer matrix switch module according to an Embodiment of the present disclosure.

Referring to FIG. 2, the buffer matrix switch module 130 of this Embodiment includes an input switch matrix 131, an output switch matrix 132, and N+ΔN buffer circuits 133 of the same structure; In this embodiment, the input switch matrix 131 and the output switch matrix 132 have the same structure, and include (N+ΔN)×N switches.

Specifically, the input switch matrix includes N columns of switch matrix units I, and each column of the switch matrix units I includes N+ΔN switch units I having an input terminal and an output terminal; the output switch matrix includes N columns of switch matrix units II, and each column of the switch matrix units II includes N+ΔN switch units II having an input terminal and an output terminal; the input terminals of each switch unit I are connected to form the input terminals of the switch matrix unit I, and serve as the input terminals CLK_in<k> of the entire buffer matrix switch module 130.

The k-th multi-phase clock signal is connected with the input terminals of the k-th column of switch matrix units I of the input switch matrix. The output terminals of the m-th row of switch units I of each column of the switch matrix units I are connected with the input terminals of the m-th buffer circuit, where k is an integer of [1, N], m is an integer of [1,N+ΔN], and ΔN is an integer greater than zero. The output terminals of the m-th buffer circuit are connected with the input terminals of the m-th row of switch units II of each column of the switch matrix units II; the output terminals of each switch unit II are connected to form the output terminals of the switch matrix unit II, and serve as the output terminals CLK_out<k> of the entire buffer matrix switch module 130.

The control signals of the input switch matrix and the output switch matrix are provided by the random signal generation module.

In this embodiment, the random signal generation module 140 generates a (N+ΔN)×N control signal matrix. The element values (i.e. control signals) in the control signal matrix are represented by '1' or '0', '1' represents switch close control, and '0' represents switch off control.

The control signals belonging to the m-th row and k-th column in the control signal matrix control the on/off of the m-th row of the switch units I in the k-th column of the switch matrix units I in the input switch matrix. The control signals belonging to the m-th row and k-th column in the control signal matrix control the on/off of the m-th row of the switch units II in the k-th column of the switch matrix units II in the output switch matrix. Then it can be known from FIG. 2 that the transmission paths of the k-th multi-phase clock input signal are determined by the element values of the k-th column in the control signal matrix.

Figures 3, 4:
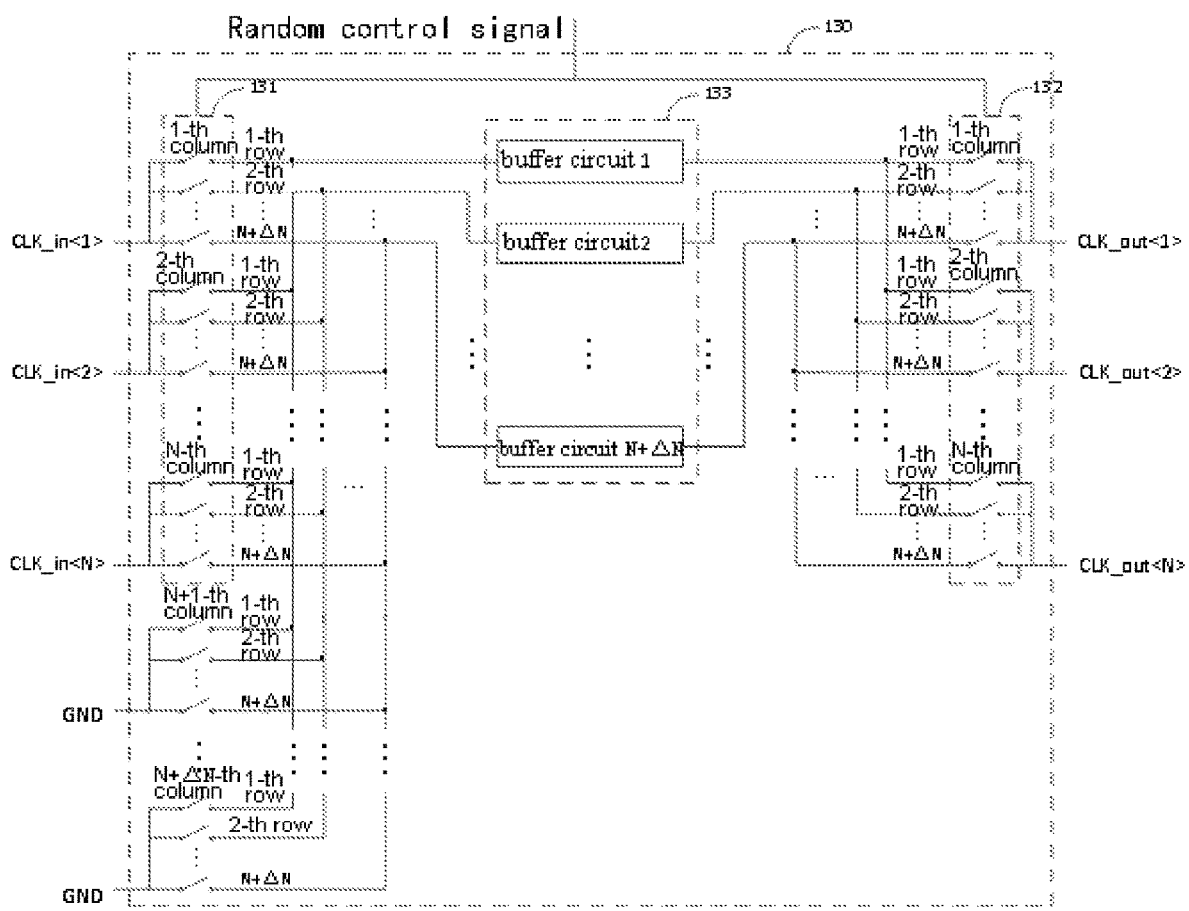
FIG. 3 is a schematic diagram showing a structure of a control signal matrix according to an Embodiment of the present disclosure.
FIG. 4 is a schematic diagram of another structure of a buffer matrix switch module according to an Embodiment of the present disclosure.

In this embodiment, the element values in the control signal matrix satisfy the following conditions: the column vector sum result of each column of the control signal matrix is 1; in N+ΔN rows of the control signal matrix, the row vector sum result of N rows is 1, and the row vector sum result of ΔN row is 0; the schematic diagram of a control signal matrix in this embodiment is shown in FIG. 3.

In this embodiment, the random signal generation module further generates 1+ΔN bit random level SV[1:1+ΔN], the value of SV [1] is '0' or '1'. Only 1 bit in ΔN bit of the SV [2:1+ΔN] is 1, and the rest bits are 0; random level SV controls the switching change of the element values in the control signal matrix.

In this embodiment, the switching change of the element values in the control signal matrix is performed in the following manner: setting the register CLK_reg[k] to store the serial number of the row that the element value is equal to 1 in the k-th column of the current control signal matrix, k=1, 2, 3, . . . , N; setting the register idle_reg [1: ΔN] to store the serial number of ΔN rows that the row vector sum results are equal to 0 in the current control signal matrix. When the falling edge of the k-th multi-phase clock input signal arrives or is at 0 level, according to the random level SV generated by the random signal generation module, determining that in the control signal matrix, whether the row vector value corresponding to the row serial number stored in register CLK_reg [k] is interchanged with the row vector value corresponding to a row serial number stored in register idle_reg, and whether the row serial number value stored in register CLK_reg [k] is interchanged with a corresponding row serial number value stored in register idle_reg at the same time. For example, when the falling edge of the k-th multi-phase clock input signal arrives or is at 0 level, when the random signal level SV [1] is '1', the row vector value corresponding to the row serial number stored in the CLK_reg [k] in the control signal matrix is interchanged with the row vector value corresponding to the row serial number stored in the idle_reg[x−1], and the row serial number values stored in CLK_reg [k] and idle_reg[x−1] are interchanged at the same time, where x is the serial number of the sequence in which the element is equal to 1 in SV[2:1+A V], and x=2, 3, . . . 1+ΔN; when the random signal SV [1] is '0', the element values in the control signal matrix are not changed. In the above manner, the element value of the k-th column in the control signal matrix can be changed to achieve the purpose of randomly switching the transmission path of the k-th multi-phase clock.

The random switching of the transmission path of the clock is achieved through the above manner. Although the circuit structure on the transmission path of each clock is exactly the same, the differences in layout design of the devices and traces and deviations in process implementation would still lead to slight differences in the delay of different paths and certain fluctuations with the change of environment. Therefore, after random switching of the clock path, the clock phase error would be whitened, thereby eliminating the impact of the clock phase error on the dynamic performance of the TI ADC.

In the foregoing implementation mode, during the working process, input terminals of ΔN buffer units in the buffer switch matrix module are in a floating state, and are switched between the floating state and the determined state, which may cause a decrease in reliability to a certain extent.

To avoid the above problems, the buffer switch matrix module 130 in this embodiment may adopt another implementation mode. Referring to FIG. 4, the input switch matrix 131 includes (N+ΔN)×(N+ΔN) switches, and the output switch matrix 132 includes (N+ΔN)×N switches. The input terminals of the added ΔN columns of switches in the input switch matrix 131 are connected with the 0 level. That is, the input switch matrix includes N+ΔN columns of switch matrix units I, and each column of the switch matrix units I includes N+ΔN switch units I having an input terminal and an output terminal.

The output switch matrix includes N columns of switch matrix units II, and each column of the switch matrix units II includes N+ΔN switch units II having an input terminal and an output terminal.

The input terminals of each switch unit I are connected to form the input terminals of the switch matrix unit I. The k-th multi-phase clock signal is connected with the input terminals of the k-th column of switch matrix units I of the input switch matrix. The output terminals of the m-th row of switch units I of each column of the switch matrix units I are connected with the input terminals of the m-th buffer circuit, where k is an integer of [1: N], m is an integer of [1: N+ΔN], and ΔN is an integer greater than zero.

The input terminals of each switch unit I in the (N+1)-th to (N+ΔN)-th columns of the switch matrix units I are connected with 0 level, and the output terminals of the m-th row of switch units I in the (N+1)-th to (N+ΔN)-th columns of the switch matrix units I are connected with the input terminals of the m-th buffer circuit.

The output terminals of the m-th buffer circuit are connected with the input terminals of the m-th row of switch units II of each column of the switch matrix units II, respectively. The output terminals of each switch unit II are connected to form the output terminals of the switch matrix unit II.

In another implementation mode of this embodiment, the element values in the control signal matrix satisfy the following conditions: the column vector sum result of each column of the control signal matrix is 1, and the row vector sum result of each row is 1. A schematic diagram of a control signal matrix in another implementation mode of this embodiment is shown in FIG. 5.

In another implementation mode, as shown in FIG. 5, the random signal generation module 140 generates a (N+ΔN)×(N+ΔN) control signal matrix, the set and function of the elements in the control signal matrix are the same as described above. Specifically, the control signals belonging to the m-th row and k-th column in the control signal matrix control the on/off of the m-th row of the switch units I in the k-th column of the switch matrix units I in the input switch matrix, k is an integer of [1, N]. The control signals belonging to the m-th row and k'-th column in the control signal matrix control the on/off of the m-th row of the switch units I in the k'-th column of the switch matrix units I in the input switch matrix, and k' is an integer of [N+1, N+ΔN]. The control signals belonging to the m-th row and k-th column in the control signal matrix control the on/off of the m-th row of the switch units II in the k-th column of the switch matrix units II in the output switch matrix.

In another implementation mode of this embodiment, the switching change of the element values in the control signal matrix is performed in the following manner: setting the register CLK_reg[k] to store the serial number of the row that the element value is equal to 1 in the k-th column of the current control signal matrix, k=1, 2, 3, . . . , N; setting the register idle_reg[1:ΔN] to store the serial numbers of ΔN rows that the element value is equal to 1 in the (N+1)-th to (N+ΔN)-th column in the current control signal matrix. The element values in the control signal matrix are updated in the same way as described in the previous implementation mode.

In another implementation mode, each buffer circuit in the buffer matrix switch module is connected with the 0 level when the clock signal is not connected; when the connected clock signal source changes, the buffer circuit is at a constant 0 level, without introducing an uncertain state.

As can be seen from the above embodiments, compared with the traditional background correction method, the present disclosure has no complicated arithmetic unit, the circuit implementation is simpler, the effect is more stable, and the implementation complexity is low. Compared with the traditional foreground trimming method, the present disclosure adds random disturbance to the clock, which can track and eliminate the influence of the fluctuation of the clock phase error along with a change in a working environment. The present disclosure can reduce the clock phase error through pre-trimming, and disturb the inherent clock phase error by randomly switching the clock path. The residual clock phase error and the spurious error component caused by the fluctuation of the residual clock phase error along with a change in the working environment are whitened to a noise floor, so as to achieve the purpose of correcting the clock phase error in real time and improving the dynamic performance of the TI ADC.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A circuit for generating a multi-phase clock having random disturbance added thereto, wherein the circuit for generating a multi-phase clock comprises a main clock module, a random signal generation module and a buffer matrix switch module;

the main clock module generates N multi-phase clock signals, wherein N is a natural number;

the buffer matrix switch module randomly switches, under a control of a random control signal output by the random signal generation module, transmission paths of the input N multi-phase clock signals, and outputs N multi-phase clock signals with random disturbance, wherein the circuit for generating a multi-phase clock further comprises a delay line module, to pre-trim a phase of the N multi-phase clock signals generated by the main clock module; the buffer matrix switch module randomly switches, under the control of the random control signal output by the random signal generation module, transmission paths of the N multi-phase clock signals pre-trimmed by the delay line module, and outputs N multi-phase clock signals with random disturbance.

2. The circuit for generating a multi-phase clock having random disturbance added thereto according to claim 1, wherein the buffer matrix switch module comprises an input switch matrix, an output switch matrix, and N+ΔN buffer circuits of a same structure; wherein, the input switch matrix includes N columns of switch matrix units I, and each column of the switch matrix units I includes N+ΔN switch units I having an input terminal and an output terminal;

the output switch matrix includes N columns of switch matrix units II, and each column of the switch matrix units II includes N+ΔN switch units II having an input terminal and an output terminal;

input terminals of the switch units I are connected to form an input terminal of a switch matrix unit I, a k-th multi-phase clock signal is connected with an input terminal of a k-th column of the switch matrix units I of the input switch matrix; an output terminal of an m-th row of the switch units I of each column of the switch matrix units I is connected with an input terminal of an m-th buffer circuit, wherein k is an integer of [1,N], m is an integer of [1,N+ΔN], and ΔN is an integer greater than zero;

an output terminal of the m-th buffer circuit is connected with an input terminal of an m-th row of switch units II of each column of the switch matrix units II, respectively, and output terminals of the switch units II are connected to form an output terminal of a switch matrix unit II.

3. The circuit for generating a multi-phase clock having random disturbance added thereto according to claim 2, wherein the random signal generation module generates a (N+ΔN)×N control signal matrix, a control signal belonging to an m-th row and k-th column in the control signal matrix controls an on/off of an m-th row of the switch units I in a k-th column of the switch matrix units I in the input switch matrix;

a control signal belonging to the m-th row and k-th column in the control signal matrix controls an on/off of an m-th row of the switch units II in a k-th column of the switch matrix units II in the output switch matrix.

4. The circuit for generating a multi-phase clock having random disturbance added thereto according to claim 3, wherein the control signal in the control signal matrix is represented by '1' or '0', '1' represents switch close control, and '0' represents switch off control; the control signal in the control signal matrix satisfies the following conditions: a column vector sum result of each column of the control signal matrix is 1, a row vector sum result of N rows is 1, and a row vector sum result of ΔN row is 0.

5. The circuit for generating a multi-phase clock having random disturbance added thereto according to claim 1, wherein the buffer matrix switch module comprises an input switch matrix, an output switch matrix, and N+ΔN buffer circuits of a same structure; wherein, the input switch matrix includes N+ΔN columns of switch matrix units I, and each column of the switch matrix units I includes N+ΔN switch units I having an input terminal and an output terminal;

the output switch matrix includes N columns of switch matrix units II, and each column of the switch matrix units II includes N+ΔN switch units II having an input terminal and an output terminal;

input terminals of the switch units I are connected to form an input terminal of a switch matrix unit I, a k-th multi-phase clock signal is connected with an input terminal of a k-th column of the switch matrix units I of the input switch matrix, an output terminal of an m-th row of switch units I of each column of the switch matrix units I is connected with an input terminal of an m-th buffer circuit, wherein k is an integer of [1,N], m is an integer of [1,N+ΔN], and ΔN is an integer greater than zero;

an input terminal of each switch unit I in the (N+1)-th to (N+ΔN)-th columns of the switch matrix units I is connected with 0 level, and an output terminal of an m-th row of switch units I in the (N+1)-th to (N+ΔN)-th columns of the switch matrix units I is connected with the input terminal of the m-th buffer circuit;

an output terminal of the m-th buffer circuit is connected with an input terminal of an m-th row of switch units II of each column of the switch matrix units II, respectively, and output terminals of the switch units II are connected to form an output terminal of a switch matrix unit II.

6. The circuit for generating a multi-phase clock having random disturbance added thereto according to claim 5, wherein the random signal generation module generates a (N+ΔN)×(N+ΔN) control signal matrix, a control signal belonging to an m-th row and k-th column in the control signal matrix controls an on/off of an m-th row of the switch units I in a k-th column of the switch matrix units I in the input switch matrix; a control signal belonging to an m-th row and k'-th column in the control signal matrix controls an on/off of an m-th row of the switch units I in a k'-th column of the switch matrix units I in the input switch matrix, and k' is an integer of [N+1, N+ΔN];

a control signal belonging to the m-th row and k-th column in the control signal matrix controls an on/off of an m-th row of the switch units II in a k-th column of the switch matrix units II in the output switch matrix.

7. The circuit for generating a multi-phase clock having random disturbance added thereto according to claim 5, wherein the control signal in the control signal matrix is represented by '1' or '0', '1' represents switch close control, and '0' represents switch off control; the control signal in the control signal matrix satisfies the following conditions: a column vector sum result of each column of the control signal matrix is 1, and the row vector sum result of each row is 1.

* * * * *